United States Patent
Van Den Bossche et al.

(10) Patent No.: US 7,594,632 B2
(45) Date of Patent: Sep. 29, 2009

(54) MOUNTING ASSEMBLY FOR AN ELECTRONIC DEVICE, SUCH AS A MODEM

(75) Inventors: Geert Van Den Bossche, Lokeren (BE); Stan Claes, Mechelen (BE); Kurt Vandenbergh, Lommel (BE)

(73) Assignee: Thomson Licensing, Boulogne Billancourt (FR)

( * ) Notice: Subject to any disclaimer, the term of this patent is extended or adjusted under 35 U.S.C. 154(b) by 0 days.

(21) Appl. No.: 10/530,337

(22) PCT Filed: Oct. 7, 2003

(86) PCT No.: PCT/EP03/50701

§ 371 (c)(1),
(2), (4) Date: Nov. 2, 2006

(87) PCT Pub. No.: WO2004/033953

PCT Pub. Date: Apr. 22, 2004

(65) Prior Publication Data

US 2007/0145230 A1    Jun. 28, 2007

(51) Int. Cl.
*A47F 5/00* (2006.01)
(52) U.S. Cl. .................. 248/309.1; 248/475.1
(58) Field of Classification Search ............ 248/309.1, 248/475.1, 480, 497, 498, 300
See application file for complete search history.

(56) References Cited

U.S. PATENT DOCUMENTS

| | | | |
|---|---|---|---|
| 1,883,834 A * | 10/1932 | Turner | 248/494 |
| 4,419,794 A * | 12/1983 | Horton et al. | 24/667 |
| 4,461,445 A | 7/1984 | Williamson et al. | |
| 5,026,016 A * | 6/1991 | Lisowski | 248/314 |
| 5,054,170 A * | 10/1991 | Otrusina | 24/580.11 |
| 5,957,421 A | 9/1999 | Barbour | |
| 6,719,260 B1 * | 4/2004 | Hart | 248/479 |
| 2003/0038222 A1 * | 2/2003 | Holmes | 248/475.1 |
| 2005/0006554 A1 * | 1/2005 | DeLine | 248/475.1 |
| 2005/0127263 A1 * | 6/2005 | Lemire | 248/475.1 |

FOREIGN PATENT DOCUMENTS

| | | |
|---|---|---|
| DE | 29519115 | 5/1996 |
| EP | 1139003 | 10/2001 |

OTHER PUBLICATIONS

Search Report Dated Feb. 16, 2004.

\* cited by examiner

*Primary Examiner*—Ramon O Ramirez
(74) *Attorney, Agent, or Firm*—Robert D. Shedd; Harvey D. Fried; Patricia Verlangieri

(57) ABSTRACT

The invention concerns a mounting assembly for releasably mounting a housing of an electronic device on a surface such as a wall or a piece of furniture, comprising receiving means to be arranged on said surface, and engaging means to be arranged on the housing for engaging with said receiving means, wherein said receiving means cooperate with at least one ventilation recess of the housing to lock said housing on the mounting assembly. The invention also concerns a corresponding electronic device and a method for fabricating a mounting assembly.

4 Claims, 2 Drawing Sheets

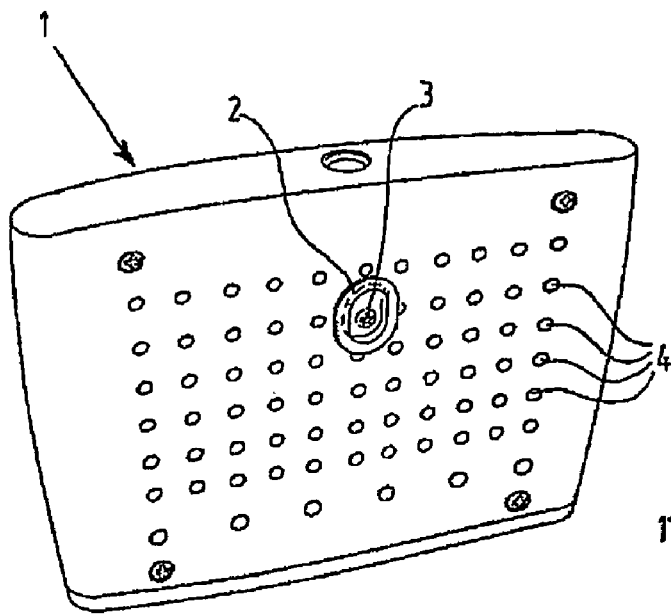
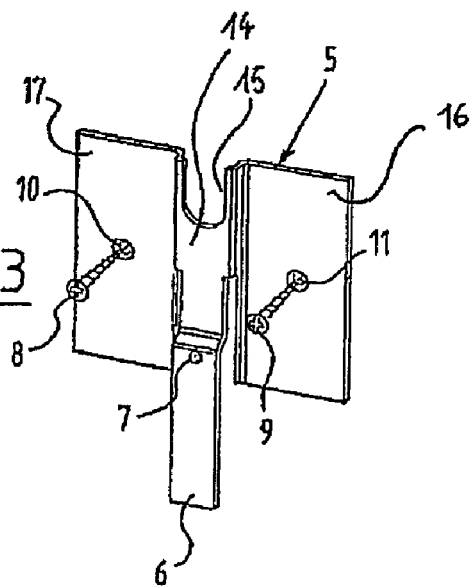
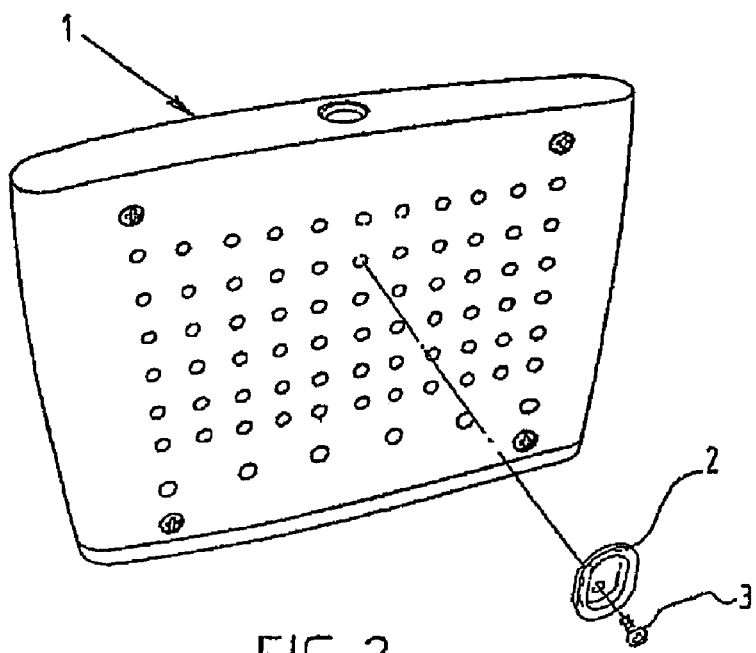

MOUNTING ASSEMBLY FOR AN ELECTRONIC DEVICE, SUCH AS A MODEM

This application claims the benefit, under 35 U.S.C. § 365 of International Application PCT/EP03/50701, filed Oct. 7, 2003, which was published in accordance with PCT Article 21(2) on Apr. 22, 2004 in English and which claims the benefit of European patent application No. 02447195.5, filed Oct. 11, 2002.

BACKGROUND OF THE INVENTION

The present invention relates to a mounting assembly for releasably mounting a housing of an electronic device, specifically of a modem, on a surface such as a wall or a piece of furniture.

Electronic devices usually have to be placed close to a telephone or other network connection points, and such connection points are not often situated close to a desk or another suitable storing means. As a consequence the electronic device will be placed for instance on the floor, where there is a risk of it being damaged or getting very dusty.

Conventional mounting assemblies for equipment generally employ a specially recessed keyhole opening in the housing of the equipment. Such an opening can be slid across one or two screws which have to be arranged in the surface.

SUMMARY OF THE INVENTION

The present invention provides a mounting assembly for releasably mounting a housing of an electronic device on a surface such as a wall or a piece of furniture, comprising receiving means to be arranged on said surface, and engaging means to be arranged on the housing for engaging with said receiving means, wherein said receiving means cooperate with at least one ventilation recess of the housing to lock said housing on the mounting assembly.

In one embodiment of the present invention said engaging means have a first part for being moveably received in the receiving means, wherein said receiving means have a moveable part which, in a first position, cooperates with a ventilation recess of the engaging means to lock said engaging means into said receiving means, and which, in a second position, allows removal of the engaging means.

According to a further embodiment of the present invention, the first part of the engaging means is formed by a sliding piece. Such a sliding piece allows easy positioning in the receiving means. In a possible embodiment this piece comprises for instance a main portion provided with an edge portion for being slidably inserted into the receiving means.

Accordingly, in another aspect of the present invention, the receiving means include guide means for slidably supporting said sliding piece. These guide means are for instance formed by at least one U-shaped groove adjusted to the size of the sliding piece.

In order to further simplify the fixing of the first part of the engaging means to the electronic device, said assembly further comprises at least one fixing means for fixing the engaging means on the housing, said at least one fixing means having a size adapted to the size of a ventilation hole of the housing.

According to an embodiment, the fixing means is comprise a screw.

Modification of the design of the electronic device is thus avoided, while ensuring a secure fastening of the engaging means at the rear of the electronic device.

According to a further development of the invention, said moveable part of the receiving means consists of a resilient bracket or lever, adapted to protrude from under the housing in locked position so as to allow a user to unlock said engaging means by pushing the protruding part. This resilient bracket springs automatically into the locking position when the engaging means are fitted into the receiving means, and can be moved manually out of its snapping position to allow removal of the engaging means.

The invention further relates to an electronic device, such as a modem, comprising a plurality of ventilation holes on a side of the housing, at least one of said ventilation holes being adapted to cooperate with engaging means of a mounting assembly, at least part of which is adapted to be fixed on a surface, for locking said housing on said mounting means.

According to a preferred aspect of the invention, the engaging means comprise a moveable part provided with at least one protrusion to be received in said at least one ventilation hole of the housing. In this manner there is no need to adapt the housing.

If it is desired to be able to adjust the position of the housing on the receiving means, a plurality of recesses can be provided in the housing, wherein the recess cooperating with the receiving means determines the position of the device.

In the preferred embodiment of the invention, the moveable part is provided with at least one protrusion to be received in the at least one recess of the engaging means, ensuring the stability of the housing when fitted in the receiving means.

The present invention also extends to a method for mounting an electronic device on a surface, such as a wall or a piece of furniture, using a mounting assembly as described above, and comprising the steps of:

arranging the engaging means on the housing of said electronic device;

arranging the receiving means on said surface;

placing said engaging means in said receiving means, wherein the moveable part is released to lock said engaging means into said receiving means.

According to a preferred aspect of this method, the engaging means are fixed to the housing by means of one screw in a ventilation hole of the housing. The type of screw thread is preferably chosen in accordance with the material of the housing. The receiving means can be fixed on the surface by means of two screws. This results in a very easy and straightforward method for mounting an electronic device on a wall, which method requires a mere three screws.

Finally, the invention also relates to a method for fabricating a mounting assembly according to any of the above described embodiments, wherein the engaging means and the receiving means are fabricated by moulding, for example injection moulding, using a single mould. This cost-effective fabrication method is made possible owing to the choice of a complementary form of the engaging and the receiving means.

BRIEF DESCRIPTION OF THE DRAWINGS

Further features and advantages of the present invention will become apparent from the following description given of three embodiments illustrated with reference to the accompanying drawings wherein:

FIG. 1 is a perspective view of the engaging means arranged at the rear of a modem, according to an embodiment of the present invention;

FIG. 2 is an exploded perspective view illustrating the arrangement of the engaging means at the rear of a modem, according to a method of the present invention;

FIG. 3 is a perspective view of the receiving means arranged on a surface, according to an embodiment of the present invention;

DETAILED DESCRIPTION OF PREFERRED EMBODIMENTS

Figure 4:
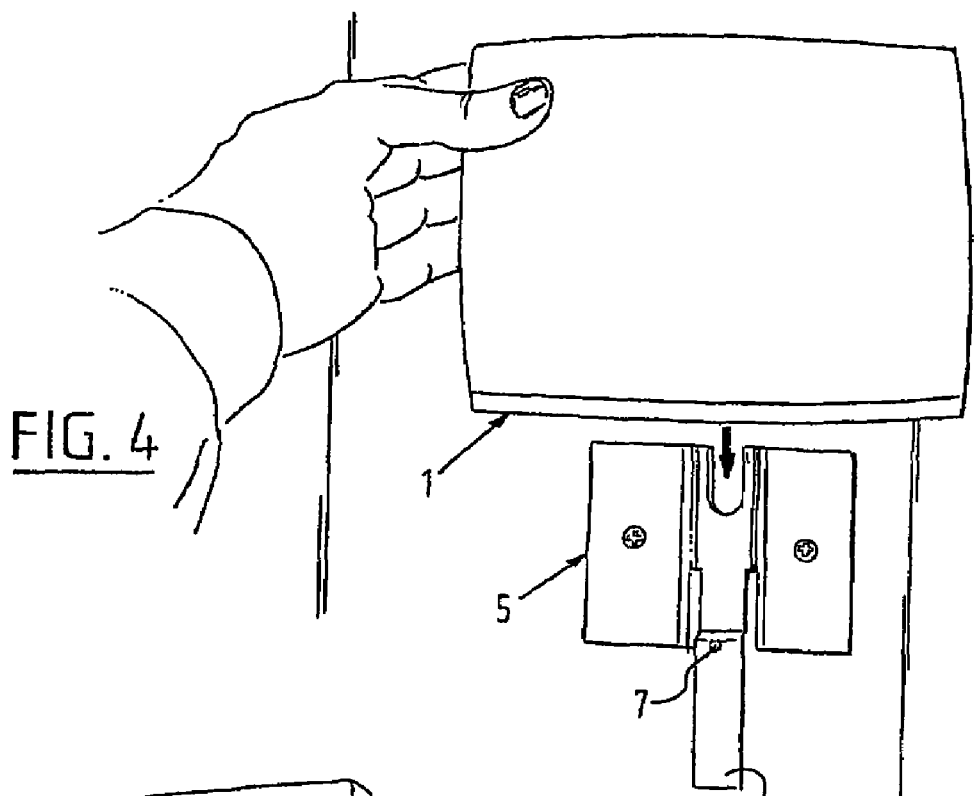
FIG. 4 illustrates the step of placing the engaging means in the receiving means arranged on the wall, according to the method of the present invention.

Referring to FIG. 1, there is shown a modem 1 provided at its rear with ventilation holes 4. As can be seen in FIG. 2, one of the ventilation holes 4 is used to secure the first part of the engaging means, which is formed by a sliding piece 2, to the rear of the modem 1 by means of a single screw 3.

FIG. 3 shows an embodiment of receiving means 5. The receiving means comprise a main part 14, two side flanges 16, 17 and a resilient bracket 6 connected to the main part 14. The main part is provided on one end with a U-shaped groove 15 which is adjusted to the size of sliding piece 2. The two side flanges 16, 17 each have a hole for receiving fixing means such as screws 10, 11. This allows easy mounting of receiving means 5 on a surface such as a wall.

The resilient bracket or lever 6 is provided with a protrusion in the form of a pin 7 for arranging in a ventilation hole 4 at the rear of modem 1.

FIG. 4 illustrates the mounting of the modem on a wall using the mounting assembly of FIGS. 1-3. The sliding piece 2 is slid into the U-shaped groove 15 of receiving means 5, wherein the resilient bracket or lever 6 is first pushed towards the wall, to spring back a little when pin 7 is received in a ventilation hole 4. This ensures a firm locking of modem 1 in receiving means 5.

Figure 5:
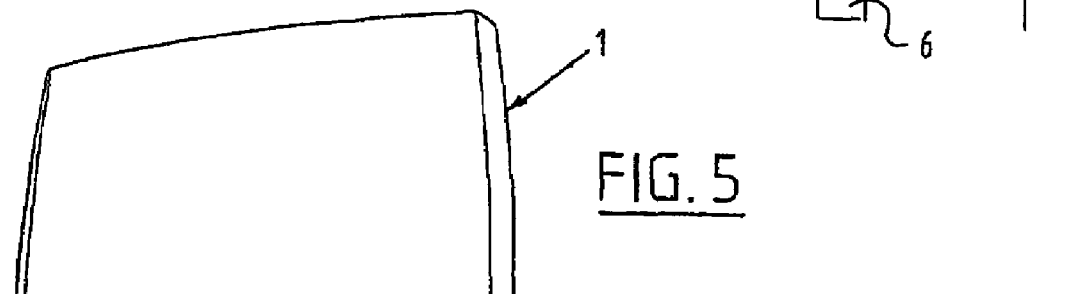
FIG. 5 illustrates a modem mounted on a wall after connection of the cables, using an embodiment of the mounting assembly according to the present invention.
Figure 6:
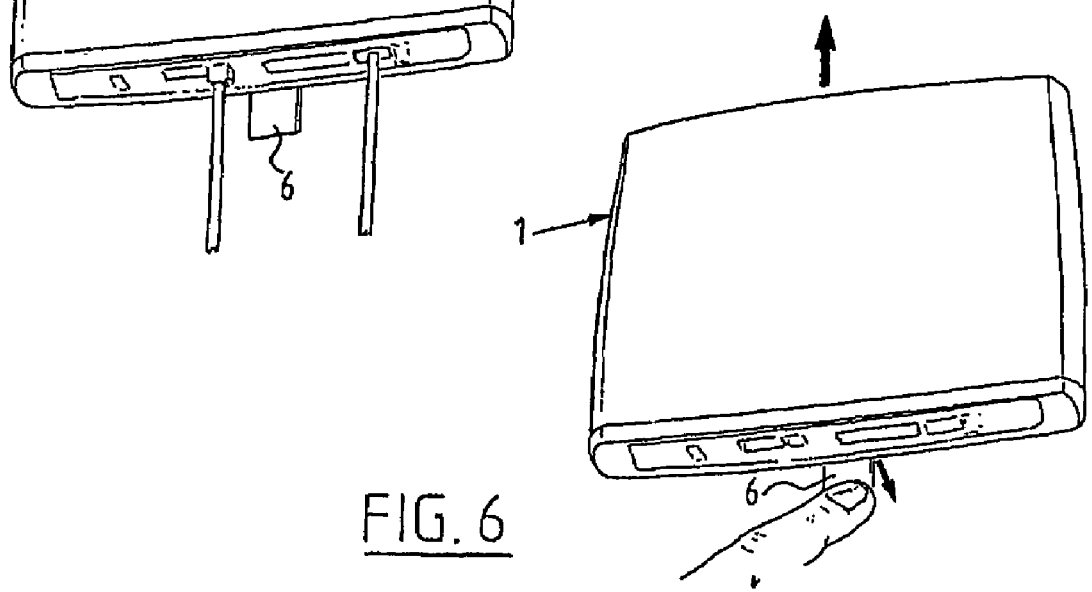
FIG. 6 illustrates removal of the modem from the receiving means, using an embodiment of the mounting assembly according to the present invention.

In this stable position of modem 1, which is shown in FIG. 5, cables can be connected to the modem without running the risk of the modem being detached.

Modem 1 can be easily removed from the wall by pushing down the resilient bracket or lever 6, releasing pin 7, and hence allowing removal of sliding piece 2 from receiving means 5.

For the purpose of unlocking the modem from the wall mounting, the bracket or level 6 protrudes in locked position compared to the modem housing to allow a user to push its extremity with a finger to cause the releasing pin 7 to be removed from its ventilation hole.

A simple variation of these embodiments consists of using receiving means with extended guide means together with an electronic device with a plurality of recesses in the housing, such that the position of the housing on the receiving means is adjustable.

According to another embodiment of the invention, the sliding piece is an integral part of the device housing, and is not removable. It is preferably placed in a recess of the housing to avoid protrusion when the device is not wall-mounted, and for example placed on a desk.

Although specific embodiments have been illustrated and described herein, it will be appreciated that the invention also covers modifications and variations, and is limited only by the claims.

The invention claimed is:

1. Mounting assembly for releasably mounting a housing of an electronic device on a surface such as a wall or a piece of furniture, comprising receiving means to be arranged on said surface, and engaging means to be arranged on the housing for engaging with said receiving means, wherein said receiving means cooperate with at least one ventilation recess of the housing to lock said housing on the mounting assembly, wherein said engaging means have a first part for being moveably received in the receiving means, wherein said receiving means have a moveable part which, in a first position, cooperates with a ventilation recess of the housing to lock said engaging means into said receiving means, and which, in a second position, allows removal of the engaging means, wherein the first part of the engaging means is formed by a sliding piece, wherein the receiving means include guide means for slidably supporting said sliding piece, wherein said guide means are formed by at least one U-shaped groove adjusted to the size of the sliding piece.

2. Mounting assembly for releasably mounting a housing of an electronic device on a surface such as a wall or a piece of furniture, comprising receiving means to be arranged on said surface, and engaging means to be arranged on the housing for engaging with said receiving means, wherein said receiving means cooperate with at least one ventilation recess of the housing to lock said housing on the mounting assembly, wherein said engaging means have a first part for being moveably received in the receiving means, wherein said receiving means have a moveable part which, in a first position, cooperates with a ventilation recess of the housing to lock said engaging means into said receiving means, and which, in a second position, allows removal of the engaging means, wherein said moveable part of the receiving means consists of a resilient bracket or lever, adapted to protrude from under the housing in locked position so as to allow a user to unlock said engaging means by pushing the protruding part.

3. An electronic device, comprising a plurality of ventilation holes on a side of the housing, at least one of said ventilation holes being adapted to cooperate with engaging means of a mounting assembly according to any one of claims 1 to 2, at least part of which is adapted to be fixed on a surface, for locking said housing on said mounting means.

4. Method for fabricating a mounting assembly according to claim 1, wherein the engaging means and the receiving means are fabricated by moulding using a single mould.

* * * * *

UNITED STATES PATENT AND TRADEMARK OFFICE
CERTIFICATE OF CORRECTION

PATENT NO. : 7,594,632 B2  Page 1 of 1
APPLICATION NO. : 10/530337
DATED : September 29, 2009
INVENTOR(S) : Van Den Bossche et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 391 days.

Signed and Sealed this

Twenty-eighth Day of September, 2010

David J. Kappos
*Director of the United States Patent and Trademark Office*